United States Patent
Okamoto et al.

(10) Patent No.: US 8,074,246 B2
(45) Date of Patent: Dec. 6, 2011

(54) BROADCAST RECEIVING APPARATUS

(75) Inventors: Kenji Okamoto, Osaka (JP); Kazuteru Adachi, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 644 days.

(21) Appl. No.: 12/230,421

(22) Filed: Aug. 28, 2008

(65) Prior Publication Data

US 2009/0083821 A1 Mar. 26, 2009

(30) Foreign Application Priority Data

Sep. 25, 2007 (JP) ................ 2007-247111

(51) Int. Cl.
*H04N 7/16* (2006.01)
(52) U.S. Cl. ......... 725/72; 455/3.06; 455/63.4; 455/272
(58) Field of Classification Search .......... None
See application file for complete search history.

(56) References Cited

U.S. PATENT DOCUMENTS

| | | | |
|---|---|---|---|
| 2006/0010473 A1* | 1/2006 | Takagi et al. | 725/72 |
| 2006/0020996 A1* | 1/2006 | Takagi et al. | 725/124 |

FOREIGN PATENT DOCUMENTS

| | | |
|---|---|---|
| JP | 2003-309415 | 10/2003 |
| JP | 2004-173062 | 6/2004 |
| JP | 2005-12329 | 1/2005 |
| JP | 2005-354619 | 12/2005 |
| JP | 2006-201285 | 8/2006 |

* cited by examiner

*Primary Examiner* — Andrew Koenig
*Assistant Examiner* — Rong Le
(74) *Attorney, Agent, or Firm* — Morgan, Lewis & Bockius LLP

(57) ABSTRACT

An appropriate direction and gain value of a smart antenna are efficiently searched for. The MPU 11 of the set top box functionally has the condition setting portion which selects a gain from the second predetermined number of steps of gains and sets it, and selects a direction from the first predetermined number of directions and sets it, the receiving state evaluation portion which generates receiving quality information that indicates the quality of a receiving state of a television broadcast received via the receiving portion, the receiving determination portion which determines whether or not a receiving state is good based on the generated receiving quality information, and the search end portion which when the receiving state is determined good, records the set one gain and one direction as the receiving conditions into the condition storage portion and makes the condition setting portion end the setting processings of gains and directions.

20 Claims, 7 Drawing Sheets

FIG.4A

| FIRST GROUP | D0, D2, D4, D6, D8, D10, D12, D14 |
|---|---|
| SECOND GROUP | D1, D3, D5, D7, D9, D11, D13, D15 |

FIG.4B

| FIRST GROUP | G0, G2 |
|---|---|
| SECOND GROUP | G1, G3 |

FIG.4C

| FIRST GROUP | D0, D4, D8, D12 |
|---|---|
| SECOND GROUP | D2, D6, D10, D14 |
| THIRD GROUP | D1, D5, D9, D13 |
| FOURTH GROUP | D3, D7, D11, D15 |

BROADCAST RECEIVING APPARATUS

This application is based on Japanese Patent Application No. 2007-247111 filed on Sep. 25, 2007, the contents of which are hereby incorporated by reference.

BACKGROUND OF THE INVENTION

1. Field of the Invention

The present invention relates to a broadcast receiving apparatus to which a smart antenna so structured as to change its directivity direction in the predetermined number of directions and to change its gain in the predetermined number of steps is connected and which receives a television broadcast via the connected antenna and outputs a radio frequency (RF) signal.

2. Description of the Related Art

Conventionally, to receive television broadcasts, directional antennas such as a Yagi antenna and the like have been used. Such directional antennas can receive a weak electric wave because of their high directivity, while they have a disadvantage that they can receive an electric wave from only a given direction. These characteristics do not become a problem so often in Japan or the like where transmission towers which transmit television broadcast waves are concentrated in an area. However, in the USA or the like, there are many districts where a plurality of transmission towers are distributed surrounding an urban area, and when a directional antenna was used, some stations were not able to receive broadcast waves even if there was a short distance from the transmission tower.

Accordingly, to solve these problems, the EIA (Electronic Industries Alliance)-909 (Antenna Control Interface) standard which controls an antenna from a receiving apparatus was made to make it possible to change an antenna's directivity. This is the standard to connect an antenna (hereinafter, called a smart antenna), whose directivity can be changed, to a receiving apparatus and to control the antenna from the receiving apparatus side via a modular terminal.

For these television broadcast receiving apparatuses to which a smart antenna can be connected, it is necessary to set the direction (hereinafter, called the optimum receiving direction) of a smart antenna where television broadcast signals can be received in the best condition, and various apparatuses and methods have been proposed to set the optimum receiving direction.

For example, disclosed is a television (TV) broadcast receiving apparatus (patent document 1) which outputs receiving direction control signals to indicate all receiving directions to a connected antenna in succession, measures the receiving intensity of a television broad cast signal received after each receiving direction is indicated, and determines whether or not the connected antenna is a smart antenna based on the measured receiving intensity. According to such a TV broadcast receiving apparatus, it is possible to determine whether or not a connected antenna is a smart antenna, and to carry out an appropriate receiving control according to a determination result, that is, a smart antenna or not.

[patent document 1] JP-A-2006-201285

However, in the TV broadcast receiving apparatus described above, because it is necessary to set the direction and gain of a connected smart antenna to appropriate values for each channel when receiving a television broadcast via the connected smart antenna, it took a long time to search for an appropriate direction and gain in some cases.

For example, when the direction of a smart antenna was able to be changed in 16 directions and the gain was able to be changed in four steps, it was necessary to measure the receiving intensity no less than 64 times for each channel. Besides, although the EIA-909 standard provides that the gain can be changed in four steps, as a matter of fact, in some smart antennas, the gain can be changed in only two steps, and in such case it was inefficient to measure the receiving intensity no less than 64 times for each channel.

SUMMARY OF THE INVENTION

The present invention has been made to cope with the conventional problems, and it is an object of the present invention to provide a broadcast receiving apparatus which can efficiently search for an appropriate direction and gain of a smart antenna.

To achieve the above-described object, a broadcast receiving apparatus described in claim 1 is a broadcast receiving apparatus to which a smart antenna so structured as to be capable of changing its directivity direction in the first predetermined number of directions and changing its gain in the second predetermined number of steps is connected, and which receives a television broadcast via the connected smart antenna and output it to a monitor, the broadcast receiving apparatus comprises: condition storage means for storing a direction and a gain as receiving conditions which are set for the smart antenna for each channel; channel setting means for selecting a channel to receive a broadcast from a plurality of predetermined channels and for setting it in succession; receiving means for via the smart antenna receiving a television broadcast corresponding to a channel set by the channel setting means; condition setting means which whenever a channel is set by the channel setting means, selects a gain from the second predetermined number of steps of gains and sets it in a predetermined order, and selects a direction from the first predetermined number of directions and sets it in a predetermined order; receiving state evaluation means which whenever a gain and a direction are set by the condition setting means, sets the smart antenna to the set one gain and one direction, and generates receiving quality information which indicates the quality of a receiving state of a television broadcast received via the receiving means; receiving determination means for determining whether or not the receiving state is good based on the receiving quality information generated by the receiving state evaluation means; and search end means which when the receiving state is determined good by the receiving determination means, records the one gain and one direction set by the condition setting means as the receiving conditions into the condition storage means, and makes the condition setting means end the setting processings of gains and directions.

According to the broadcast receiving apparatus described in claim 1, a direction and a gain set for a smart antenna for each channel are stored in the condition storage means, a receiving channel selected from a plurality of predetermined channels is set in succession, and a television broadcast corresponding to the set channel is received by the receiving means via the smart antenna. Besides, whenever a channel is set, a gain selected from the second predetermined number of steps of gains is set in a predetermined order, and a direction selected from the first predetermined number of directions is set in a predetermined order. And whenever a gain and a direction are set, the smart antenna is set to the set gain and direction, and receiving quality information which indicates the quality of a receiving state of a television broadcast received via the receiving means is generated. Then, it is determined whether or not the receiving state is good based on the generated receiving quality information, and when the receiving state is determined good, the set one gain and one direction are recorded as the receiving conditions in the condition storage means, and then the setting processings of gains and directions for the smart antenna are ended. Accordingly, an appropriate direction and an appropriate gain value of the smart antenna can be efficiently searched for.

As described above, whenever a channel is set, a gain and a direction are set and receiving quality information which indicates the quality of a receiving state of a received television broadcast is generated, then when the receiving state is determined good based on the generated receiving quality information, the set one gain and one direction are recorded as the receiving conditions in the condition storage means, and the setting processings of gains and directions are terminated. Accordingly, the setting processings of gains and directions are ended at the time when a receiving state is determined good, and the receiving quality information corresponding to all the gains and directions need not be generated, thereby an appropriate direction and an appropriate gain value of a smart antenna can be efficiently searched for.

BRIEF DESCRIPTION OF THE DRAWING

FIG. 4 is a table showing an example of direction identification information stored in a direction storage portion and an example of gain identification information stored in a gain storage portion.

DETAILED DESCRIPTION OF THE PREFERRED EMBODIMENTS

Figure 1:
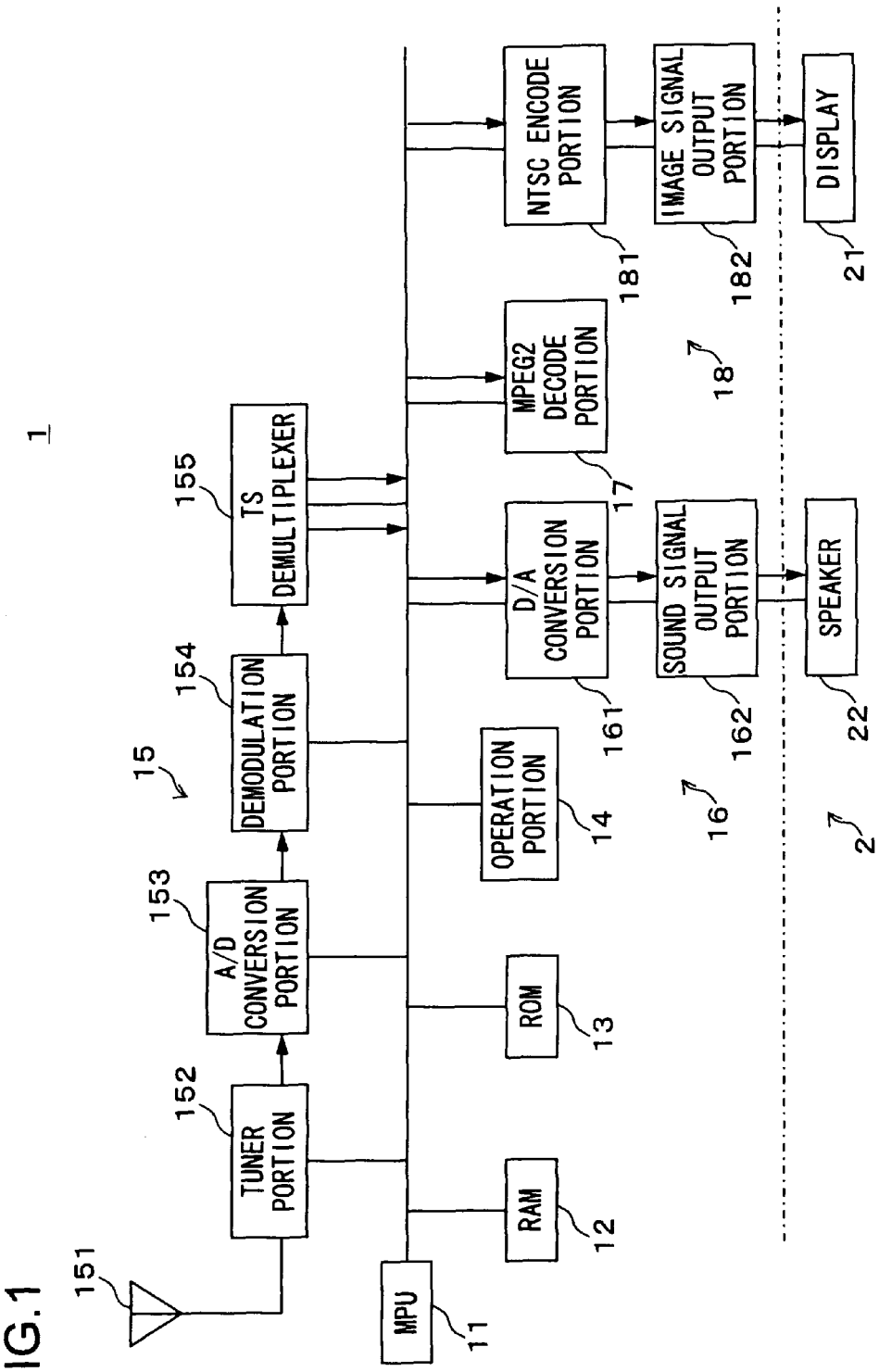
FIG. 1 is a block diagram showing a configuration example of a set top box according to the present invention.

Infra, an embodiment of the present invention is explained referring to the drawings. FIG. 1 is a block diagram showing a configuration example of a set top box according to the present invention. A set top box (STB) 1 (which corresponds to a broadcast receiving apparatus) receives a television broadcast and outputs it to an output apparatus 2, and comprises a MPU 11, a RAM 12, a ROM 13, an operation portion 14, a receiving portion 15, a sound output portion 16, a MPEG2 decode portion 17, and an image output portion 18.

The output apparatus 2 includes a display 21 and a speaker 22, outputs a sound corresponding to a sound signal from the set top box 1, and outputs an image corresponding to an image signal from the set top box 1. The display 21 (which corresponds to a monitor) includes a LCD (liquid crystal display), a PDP (plasma display panel) and the like, and displays an image corresponding to an image signal from the set top box 1 (an image signal output portion 182 explained later). The speaker 22 outputs a sound corresponding to a sound signal output from the set top box 1 (a sound signal output portion 162 explained later).

The MPU (Micro Processing Unit) 11 controls over the entire set top box 1. The RAM (random access memory) 12 stores information to be read and written such as sound information, image information and the like. The ROM (read only memory) 13 stores the control program and the like to operate the MPU 11.

The operation portion 14 receives various operations such as on-off operation of a power supply, channel selection and the like. The receiving portion 15 (which corresponds to receiving means) receives a television broadcast and demodulates it, and includes an antenna portion 151, a tuner portion 152, an A/D conversion portion 153, a demodulation portion 154, and a TS demultiplexer 155.

The antenna portion 151 includes a smart antenna which can change directivity (direction) and gain conforming to the EIA-909 standard, and receives a television broadcast. The tuner portion 152 selects a preset-channel television broadcast from among television broadcast waves received by the antenna portion 151. The A/D conversion portion 153 converts an output signal (analog signal) from the tuner 152 into digital information. The demodulation portion 154 demodulates output information from the A/D conversion portion 153. The TS (transport stream) demultiplexer 155 separates output information demodulated by the demodulation portion 154 corresponding to each kind of information (image information, sound information, control information etc.) and outputs them.

The sound output portion 16 outputs a sound corresponding to a television broadcast received by the receiving portion 15, and has a D/A conversion portion 161 and a sound signal output portion 162. The D/A conversion portion 161 converts sound information (digital information) output from the TS demultiplexer 155 into an analog signal. The sound signal output portion 162 outputs a sound signal, which is already converted into an analog signal by the D/A conversion portion 161, to the speaker 22 of the output apparatus 2.

The MPEG (Motion Picture Experts Group)2 decode portion 17 decodes image information output from the TS demultiplexer 155 into image information before compression.

The image output portion 18 outputs image information decoded by the MPEG2 decode portion 17, and has a NTSC encode portion 181 and an image signal output portion 182. The NTSC (National Television Standard Committee) encode portion 181 converts image information decoded by the MPEG2 decode portion 17 into an image signal of the NTSC system. The image signal output portion 182 outputs an image signal of the NTSC system output from the NTSC encode portion 181 to the display 21 of the output apparatus 2.

Next, an operation of the set top box 1 during the time when it receives a broadcast is explained. First, a transmitted digital television broadcast wave is received by the antenna portion 151. If an channel selection operation is received via the operation portion 14, the transponder change-over is carried out for the broadcast reception by the tuner portion 152. A received digital broadcast wave is converted into digital information by the A/D conversion portion 153 and demodulated by the demodulation portion 154.

A digital broadcast wave is transmitted from a transmitting side (transmitting station) as a TS (transport stream) packet. This TS packet includes image information, sound information, control signal etc. and these information is separated and output by the TS demultiplexer 155, and stored into the RAM 12. Sound information read out from the RAM 12 is converted into an analog signal by the D/A conversion portion 161 and the sound is output from the speaker 22 of the output apparatus 2 via the sound signal output portion 162.

Image information read out from the RAM 12 is decoded into image information by the MPEG2 decode portion 17 before compression, converted into a television signal of the NTSC system by the NTSC encode portion 181, and displayed on the display 21 of the output apparatus 2 via the image signal output portion 182.

Figure 2:
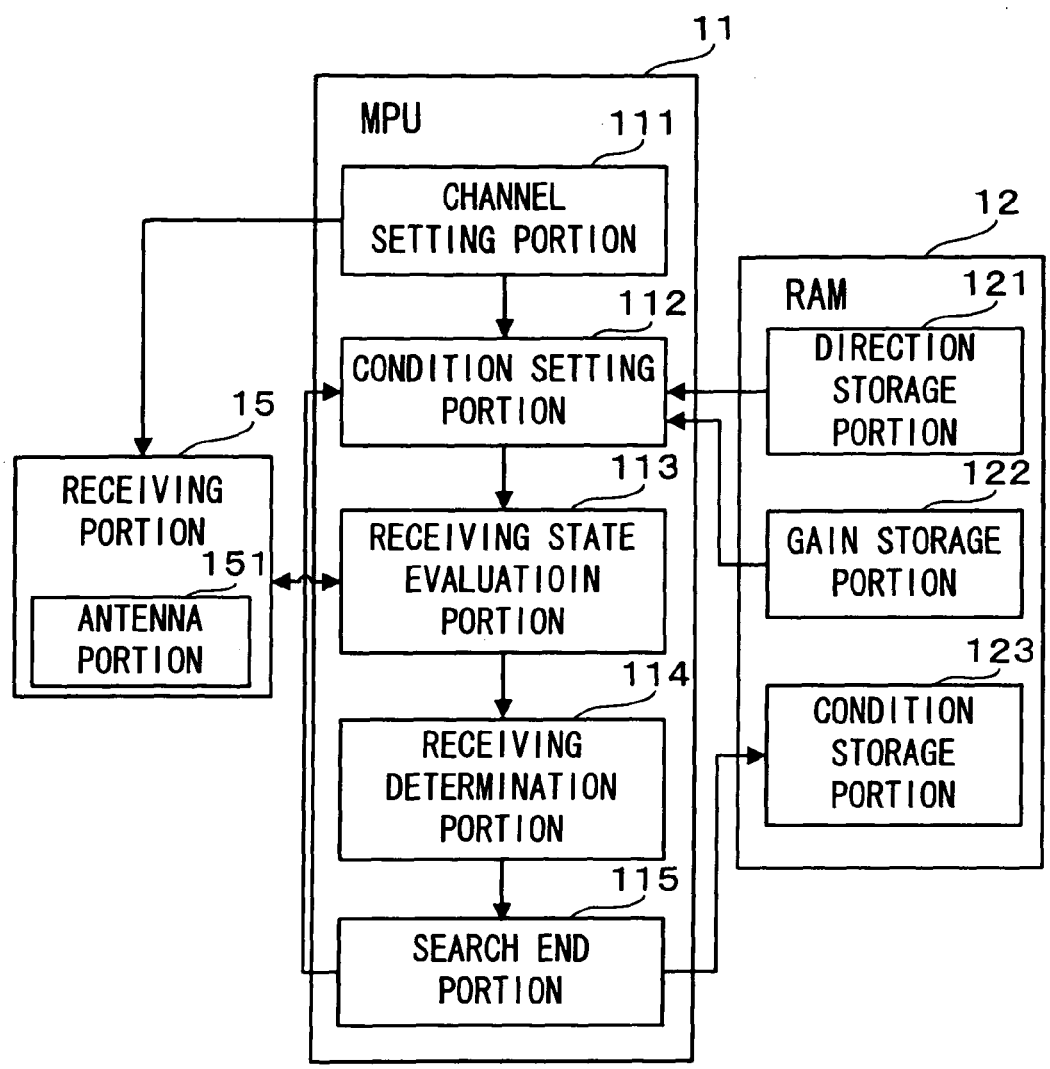
FIG. 2 is a block diagram showing a configuration example of the main portion of a set top box according to the present invention.

FIG. 2 is a block diagram showing a configuration example of the main portion of the set top box 1 according to the present invention. The MPU 11 of the set top box 1 shown in FIG. 1 has functionally a channel setting portion 111, a condition setting portion 112, a receiving state evaluation portion 113, a receiving determination portion 114, and a search end portion 115, and the RAM 12 has functionally a direction storage portion 121, a gain storage portion 122, and a condition storage portion 123.

The MPU 11 reads out the control program which is stored in the ROM 13 and the like in advance, executes it, and functions as the channel setting portion 111, the condition setting portion 112, the receiving state evaluation portion 113, the receiving determination portion 114, and the search end portion 115, and the like, and makes the RAM 12 function as a functional portion such as the direction storage portion 121, the gain storage portion 122, the condition storage portion 123 and the like.

Of various data stored in the RAM 12 and the ROM 13 shown in FIG. 1, data which can be stored in a removable recording medium may be read out by drivers for data reading apparatuses such as a hard disc drive, an optical disc drive, a flexible disc drive, a silicon disc dive, a cassette medium reader etc. In this case, recording media are, for example, a hard disc, an optical disc, a flexible disc, a CD (compact disc), a DVD (digital versatile disc), a semiconductor memory etc.

The direction storage portion 121 (which corresponds to direction storage means) stores direction identification information in advance as identification information on directions for each one of a plurality of groups (here, two) obtained by dividing the first predetermined number of directions (here, 16). Specifically, the directions stored in the direction storage portion 121 are the directions each being selected clockwise from every predetermined number of directions (here, 2) of the first predetermined number (here, 16) of directions. The direction identification information stored in the direction storage portion 121 is read out by the condition setting portions 112.

Figure 3A:
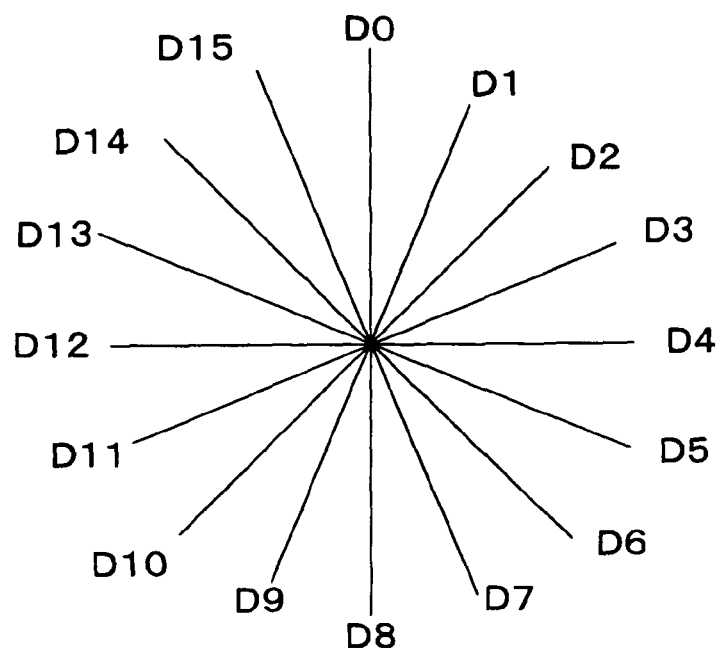
FIG. 3 is a view showing directions and gains which can be set for a smart antenna.
Figure 3B:
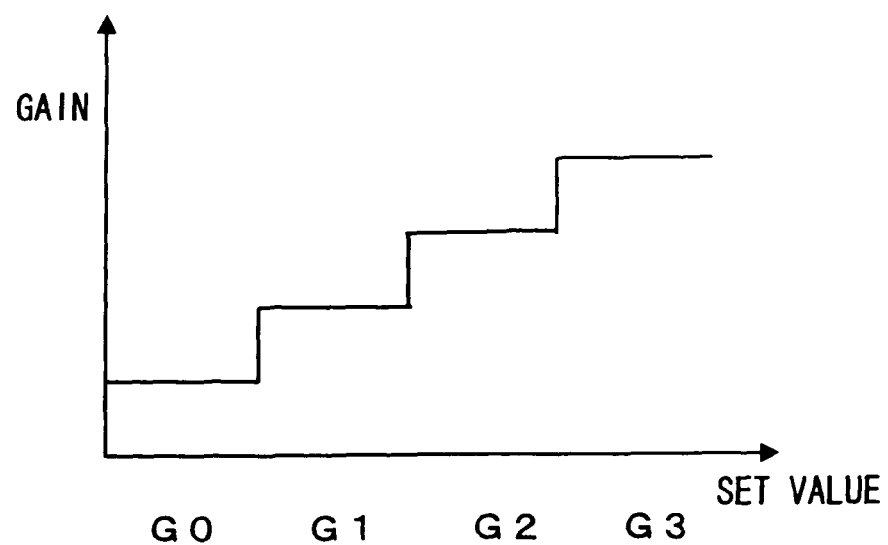

FIG. 3 (*a*) is a view showing an example of directions of a smart antenna which can be set. As shown FIG. 3 (*a*), a smart antenna connected to the antenna portion 151 is set to any one of the 16 directions D0 to D15 having an angle of 22.5° therebetween.

FIG. 4 (*a*) is a table showing an example of direction identification information stored in the direction storage portion 121. As shown in FIG. 4 (*a*), the 16 directions D0 to D15 shown in FIG. 3 (*a*) are divided into two groups (first and second groups). The direction storage portion 121 stores the direction identification information (D0, D2, D4, D6, D8, D10, D12, and D14) as the first group corresponding to the eight directions obtained by selecting clockwise from the 16 directions D0 to D15 for every two directions, and stores the direction identification information corresponding to the remaining eight directions as the second group.

Returning to FIG. 2 again, a configuration of the main portion of the set top box 1 is explained. The gain storage portion 122 (which corresponds to gain storage means) stores gain identification information in advance as identification information on gains for each one of a plurality of groups (here, two) obtained by dividing the second predetermined number of steps (here, 4) of gains. Specifically, the gains stored in the first group in the gain storage portion 122 are the gains each being selected from every predetermined number of steps (here, 2 steps) of gains of the second predetermined number (here, 4) of gains. The gain identification information stored in the gain storage portion 122 is read out by the condition setting portion 112.

FIG. 3 (*b*) is an example of gains of a smart antenna which can be set. As shown FIG. 3 (*b*), a smart antenna connected to the antenna portion 151 is set to any one of the gains G0 to G3. Here, the gain values become larger in the order of G0 to G3.

FIG. 4 (*b*) is a table showing an example of the gain identification information stored in the gain storage portion 122. As shown in FIG. 4 (*b*), the 4 gains G0 to G3 shown in FIG. 3 (*b*) are divided into two groups (first and second groups). The gain storage portion 122 stores the gain identification information (G0 and G2) as the first group corresponding to the two gains obtained by selecting from the 4 gains G0 to G3 for every predetermined two steps, and stores the gain identification information corresponding to the remaining two gains as the second group (G1 and G3).

Returning to FIG. 2 again, the configuration of the main portion of the set top box 1 is explained. The condition storage portion 123 (which corresponds to condition storage means) stores a direction and a gain for each channel as receiving conditions which are set for a smart antenna. The directions and gains stored in the condition storage portion 123 are recorded (written) by the search end portion 115.

The channel setting portion 111 (which corresponds to channel setting means) sets a channel for broadcast reception in succession selected from a plurality of predetermined channels (here, 68 channels of the channel numbers 2 to 69).

Whenever a channel is set by the channel setting portion 111, the condition setting portion 112 (which corresponds to condition setting means) sets a gain in a predetermined order selected from the second predetermined number (here, 4) of steps of gains and sets a direction in a predetermined order selected from the first predetermined number (here, 16) of directions. The condition setting portion 112 terminates the setting processing of gains and directions following an instruction from the search end portion 115.

Specifically, first, the condition setting portion 112 sets a gain (e.g., G0) selected from the gains G0 and G2 contained in one group (here, the first group shown in FIG. 4 (*b*)) stored in the gain storage portion 122, and sets a direction in a predetermined order selected from one group (here, the first group shown in FIG. 4 (*a*)) stored in the direction storage portion 121. After all the directions contained in one group (here, the first group shown in FIG. 4 (*a*)) stored in the direction storage portion 121 are set, the condition setting portion 112 sets the other one gain (here, the gain G2) selected from the gains G0 and G2 contained in one group (here, the first group shown in FIG. 4 (*b*)) stored in the gain storage portion 122, and sets a direction in a predetermined order selected from the directions contained in one group (here, the first group shown in FIG. 4 (*a*)) stored in the direction storage portion 121.

Then, after all the directions contained in one group (here, the first group shown in FIG. 4 (*a*)) stored in the direction storage portion 121 are set, the condition setting portion 112 sets one gain (here, the gain G0) selected from the gains G0 and G2 contained in one group (here, the first group shown in FIG. 4 (*b*)) stored in the gain storage portion 122, and sets a direction in a predetermined order selected from the directions contained in the other one group (here, the second group shown in FIG. 4 (*a*)) stored in the direction storage portion 121. Then, after all the directions contained in the other one group (here, the second group shown in FIG. 4 (*a*)) stored in the direction storage portion 121 are set, the condition setting portion 112 sets the other one gain (here, the gain G2) selected from the gains G0 and G2 contained in one group (here, the first group shown in FIG. 4 (b)) stored in the gain storage portion 122, and sets a direction in a predetermined order selected from the directions contained in the other one group (here, the second group shown in FIG. 4 (a)) stored in the direction storage portion 121.

Whenever a gain and a direction are set by the condition setting portion 112, the receiving state evaluation portion 113 (which corresponds to receiving state evaluation means) sets the smart antenna to the set one gain and one direction, and generates receiving quality information which indicates the quality of a receiving state of a television broadcast received via the receiving portion 15.

Specifically, the receiving state evaluation portion 113 generates receiving state information a predetermined times (e.g., five times) for every predetermined time period (e.g., 0.1 sec.), and generates a BER (bit error rate) as receiving state information.

The receiving determination portion 114 (which corresponds to receiving determination means) determines whether or not a receiving state is good based on the receiving quality information generated by the receiving state evaluation portion 113. Specifically, when all of the predetermined number (e.g, 5) of pieces of receiving quality information (here, BERs) generated by the receiving state evaluation portion 113 indicate that the receiving state is good (e.g., the BERs$\leq$the threshold, e.g., $10^{-7}$), the receiving determination portion 114 determines that the receiving state is good.

When the receiving state is determined good by the receiving determination portion 114, the search end portion 115 (which corresponds to search end means) records the set one gain and one direction as the receiving conditions set by the condition setting portion 112 into the condition storage portion 123 and makes the condition setting portion 112 end the setting processing of gains and directions.

In addition, all the gains (here, the gains G0 and G2) contained in one group (here, the first group shown in FIG. 4 (b)) stored in the gain storage portion 122 are set, the search end portion 115 makes the condition setting portion 112 end the setting processing of gains and directions. In other words, the search end portion 115 makes the condition setting portion 112 end the setting processing of gains and directions without setting all the gains contained in the other group (here, the second group shown in FIG. 4 (b)) stored in the gain storage portion 122.

Further, when the receiving state is not determined good by the receiving determination portion 114, the search end portion 115 records the gain and direction, which shows the best receiving quality information, of the gains and directions set by the condition setting portion 112 as the receiving conditions into the condition storage portion 123. Here, the conditions (the gain and direction) which show the best receiving quality information are, for example, the conditions in which the average value of the predetermined number (here, 5) of BERs generated by the receiving state evaluation portion 113 is the smallest.

Figure 5:
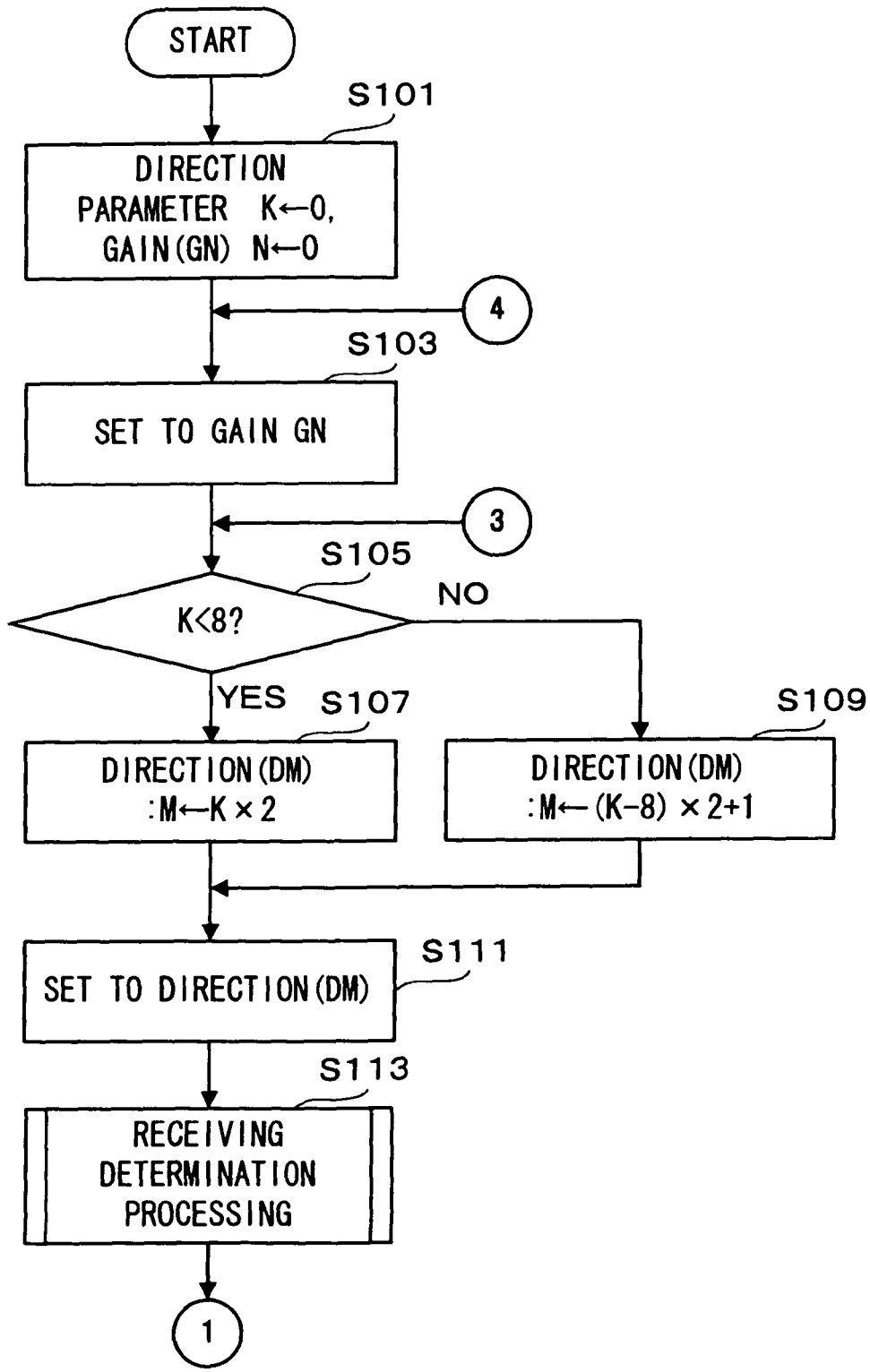
FIG. 5 is a flowchart showing an operation example (the first half) of a set top box (chiefly a MPU).
Figure 6:
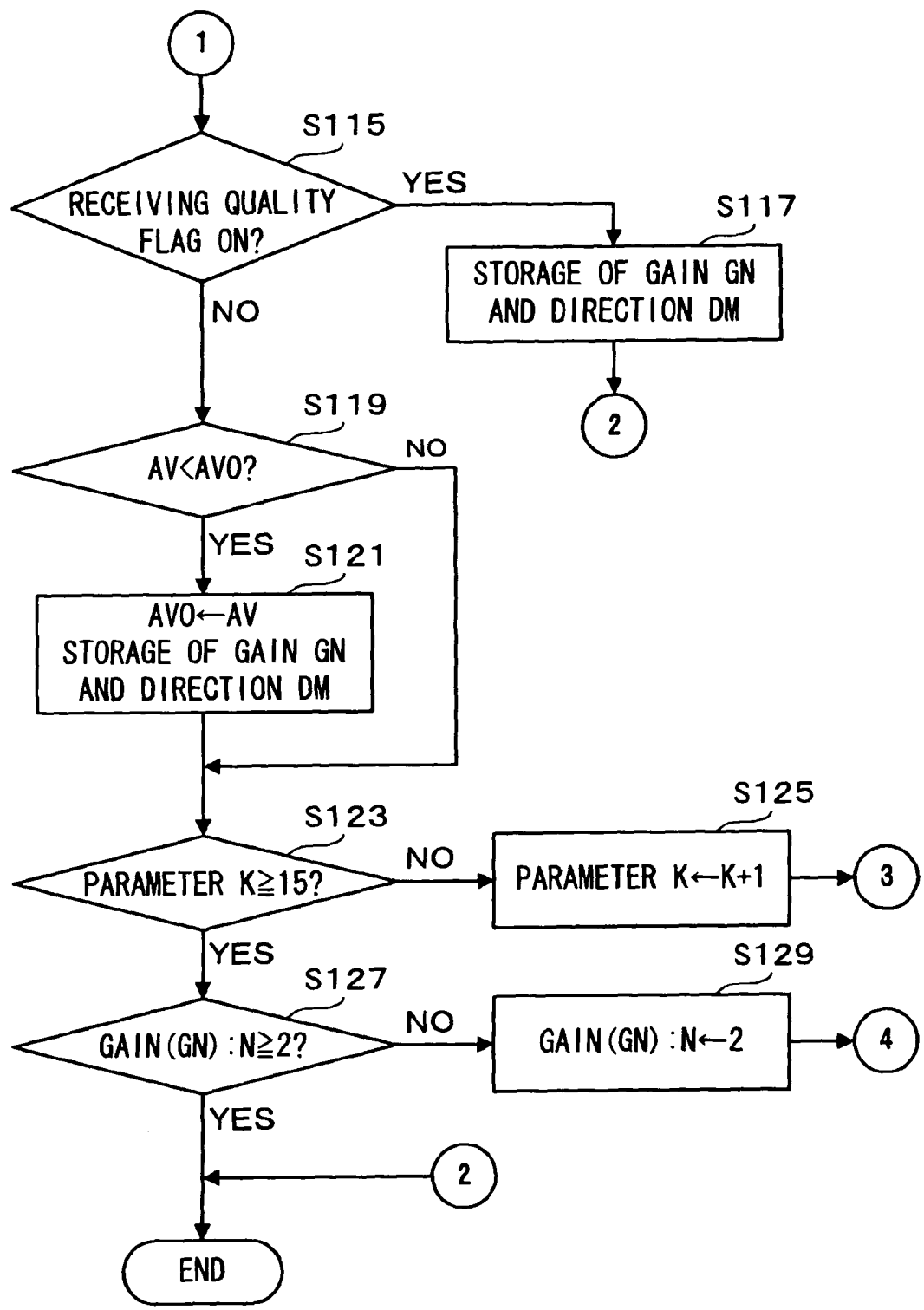
FIG. 6 is a flowchart showing an operation example (the second half) of a set top box (chiefly a MPU).

FIGS. 5 and 6 are flowcharts each showing an operation example of the set top box 1 (chiefly the MPU 11). Here, for convenience, explained is a case where the gains and directions in the plurality (here, 2) of groups shown in FIGS. 4 (a) and (b) are respectively stored in the direction storage portion 121 and the gain storage portion 122. Besides, here, for convenience, explained is a case where a gain and a direction to be set to a smart antenna are searched for one of 68 channels of the channel numbers 2 to 69.

First, as shown in FIG. 5, by the condition setting portion 112, a parameter K which limits a direction of a smart antenna is set to 0, and a parameter N which indicates a gain (GN) of a smart antenna is set to 0 (S101). Then, a gain of a smart antenna is set to the gain GN (here, the gain G0) (S103). Next, the condition setting portion 112 determines whether or not the direction parameter K is smaller than 8 (to or not to set a direction contained in the first group shown in FIG. 4 (a)) (S105).

If it is determined that the direction parameter K is smaller than 8 (to set a direction contained in the first group shown in FIG. 4 (a)) (YES in S105), a parameter M which shows a direction (DM) of a smart antenna is set to K×2 (S107). On the other hand, if it is determined that the parameter K is not smaller than 8 (to set a direction contained in the second group shown in FIG. 4 (a)) (NO in S105), the parameter M which shows a direction (DM) of a smart antenna is set to (K−8)×2+1 (S109).

When the processing in S107 or S109 is ended, the direction of a smart antenna is set by the receiving state evaluation portion 113 to the direction DM of a smart antenna which is set in the step S107 or S109 (S111). Then, the determination processing is carried out by the receiving state evaluation portion 113 and the receiving determination portion 114 and the like to determine whether or not the receiving state is good (S111).

Next, as shown in FIG. 6, it is determined by the search end portion 115 whether or not a receiving quality flag to show if a receiving state is good or not is ON (S115). If the receiving quality flag is determined ON (the receiving state is good) (YES in S115), the gain GN of a smart antenna set in the step S103 shown in FIG. 5, and the direction DM of the smart antenna set in the step S111 shown in FIG. 5 are recorded into the condition storage portion 123 (S117) and the processing is ended by the search end portion 115.

If the receiving quality flag is determined OFF (the receiving state is not good) (NO in S115), it is determined by the search end portion 115 whether or not the average value AV of the BERs obtained in the step S113 shown in FIG. 5 is smaller than the smallest value AV0 of the average values AV of the BERs that have been obtained so far (S119). If the average value AV is determined equal to or larger than the smallest value AV0 (NO in S119), the processing advances to the step S123. If the average value AV is determined smaller than the smallest value AV0 (YES in S119), the smallest value AV0 is updated to the average value AV by the search end portion 115, and the gain GN of the smart antenna set in the step S103 shown in FIG. 5 and the direction DM of the smart antenna set in the step S111 are recorded into the condition storage portion 123 (S121).

When it is determined NO in the step S119 or the processing in the step S121 is completed, it is determined by the condition setting portion 112 whether or not the direction parameter K that limits a direction of a smart antenna is equal to or larger than 15 (the setting of all the directions contained in the second group shown in FIG. 4 (a) is completed or not) (S123). If it is determined that the direction parameter K is not equal to nor larger than 15 (NO in S123), the direction parameter K is increased 1 by the condition setting portion 112 (S125), the processing is returned to the step 105 shown in FIG. 5, and the step 105 and the following processings are repeatedly executed.

If it is determined that the direction parameter K is equal to or larger than 15 (YES in S123), it is determined by the condition setting portion 112 if the parameter N, which shows a gain GN of a smart antenna, is equal to or larger than 2 (all the gains contained in the first group shown in FIG. 4 (b) are set or not) (S127). If it is determined that the parameter N is not equal to nor larger than 2 (NO in S127), the parameter N is set to 2 (S129), the processing shown in FIG. 5 is returned to the step S103, and the step S103 the following processings are repeatedly executed. If it is determined that the parameter N is equal to or larger than 2 (YES in S127), the processing is ended.

Figure 7:
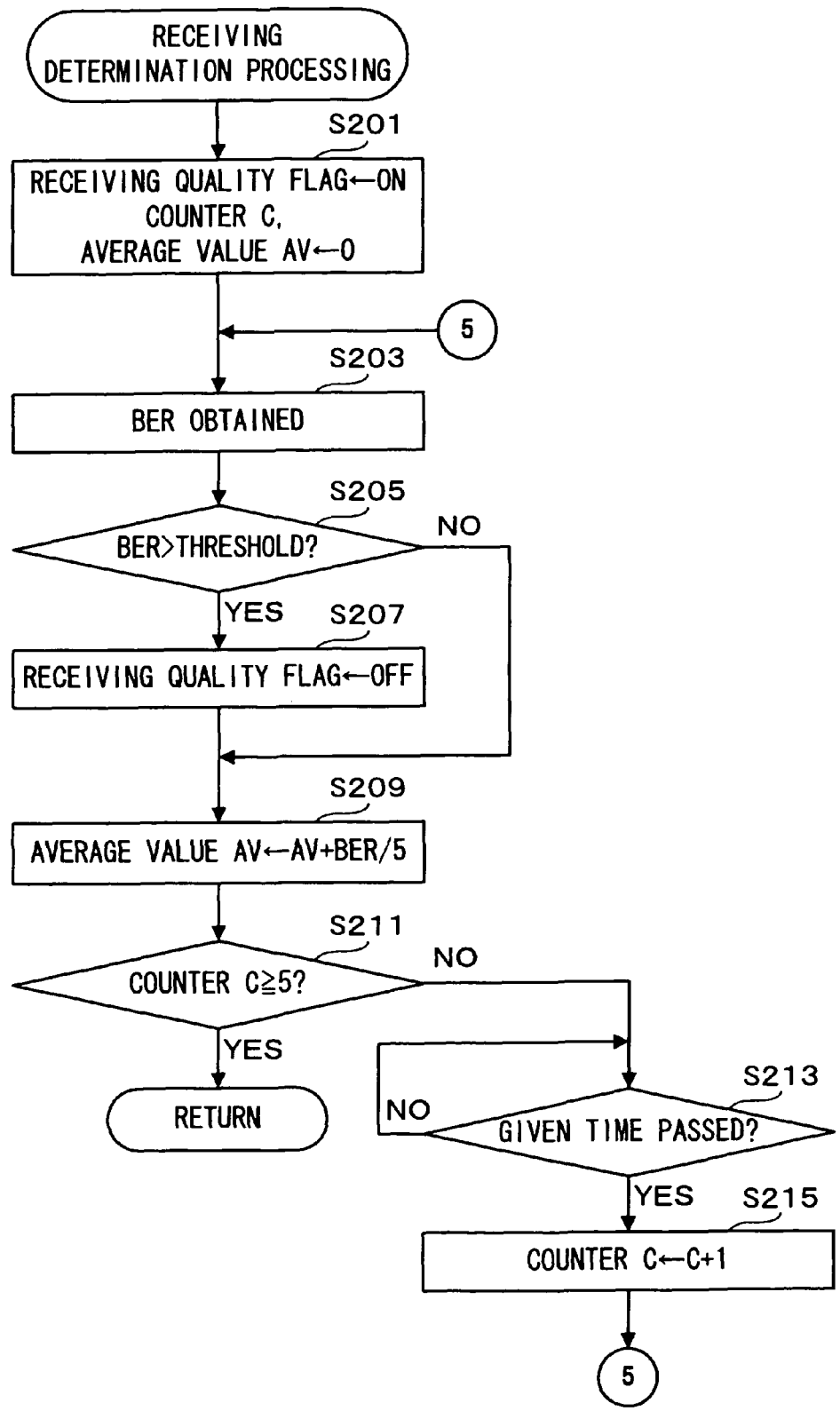
FIG. 7 is a flowchart showing an example of the receiving determination processing executed in the step S113 shown in the flowchart shown in FIG. 5.

FIG. 7 is a flowchart showing an example of a receiving determination processing executed in the step S113 in the flowchart shown in FIG. 5. First, by the receiving determination portion 114, the receiving quality flag which shows a receiving state is good or not is set to ON, and a counter C which shows the number of generations of BERs and the average value AV of BERs are set to 0 (S201). Then, a BER is obtained and generated by the receiving state evaluation portion 113 (S203). Next, it is determined by the receiving determination portion 114 whether or not the BER generated in the step S203 is larger than the predetermined threshold (e.g., $10^{-7}$) (S205).

If the BER is determined equal to or smaller than the threshold ($10^{-7}$) (NO in S205), the processing goes to the step S209. If the BER is determined larger than the threshold ($10^{-7}$) (YES in S205), the receiving quality flag is set to OFF (S207). If the determination is NO is the step S205 or the processing in the step S207 is completed, a value obtained by dividing the BER generated in the step S203 by 5 (the value corresponding to the predetermined number of generations of BERs) is added to the average value AV to update it (S209).

Then, it is determined by the receiving state evaluation portion 113 whether or not the counter C is equal to or larger than 5 (the value corresponding to the predetermined number of generations of BERs) (S211). If the counter C is determined equal to or larger than 5 (YES in S211), the processing is returned. If it is determined that the counter C is not equal to nor larger than 5 (NO in S211), it is determined by the receiving state evaluation portion 113 whether or not a predetermined time (e.g., 0.1 sec.) has passed (S213). If it is determined that the predetermined time has not passed (NO in S213), the processing goes into a waiting state. If it is determined that the predetermined time has passed (YES in S213), the counter C is increased 1 (S215), the processing is returned to S203, and the step S203 and the following processings are repeatedly executed.

In this way, a channel is selected from a predetermined number (here, 68) of channels and is set in succession, and the television broadcast corresponding to the set channel is received by the receiving portion 15 via a smart antenna. Whenever a channel is set, a gain selected from the second predetermined number (here, 4) of steps of gains and is set in a predetermined order, and a direction selected from the first predetermined number (here, 16) of directions is set in a predetermined order. And whenever a gain and a direction are set, the smart antenna is set to the set gain and direction, and the receiving quality information (here, the BER information) which indicates the quality of a receiving state of the television broadcast received via the receiving portion 15 is generated. Based on the generated receiving quality information, it is determined if the receiving state is good or not, and if the receiving state is determined good, the set one gain and direction are recorded as the receiving conditions into the condition storage portion 123, and then the setting processing of gains and directions is terminated. Accordingly, an appropriate direction and gain value of the smart antenna can be efficiently searched for.

As described above, whenever a channel is set, a gain and a direction are set and the receiving quality information (here, the BER information) which indicates the quality of a receiving state of a received television broadcast is generated, and if the receiving state is determined good based on the generated receiving quality information, the set one gain and direction are recorded as the receiving conditions into the condition storage portion 123, and the setting processing of gains and directions is ended. Accordingly, the setting processing of gains and directions is ended at the time when the receiving state is determined good, and the receiving quality information on all the gains and directions does not need to be generated, and thereby an appropriate direction and gain value of a smart antenna can be efficiently searched for.

Besides, because the receiving state is determined good when the receiving quality information (here, the BER information) is generated a predetermined number of times (here, 5 times) for every predetermined time period (here, 0.1 sec.), and because all the receiving quality information for the predetermined number of times indicates that the receiving state is good, a more appropriate direction and gain value of the smart antenna can be searched for.

As described above, because the receiving state is determined good when the receiving quality information is generated a predetermined number of times for every predetermined time period, and because all the receiving quality information for the predetermined number of times indicates that the receiving state is good, an appropriate direction and gain can be searched for even if a receiving state is changed by environmental changes (e.g., the passage of an obstacle such as an airplane or the like which blocks broadcast waves), and accordingly a more appropriate direction and gain value of a smart antenna can be searched for.

Further, because a BER is generated as the receiving quality information and it is possible to determine whether or not a receiving state is good based on a determination result if the BER is equal to or smaller than a predetermined threshold (e.g., $10^{-7}$), a more appropriate direction and gain value of an smart antenna can be efficiently searched for with a simple approach.

In addition, the first predetermined number (here, 16) of directions are divided into a plurality of groups (here, 2), and the direction identification information which is the identification information on directions is stored for each group in the direction storage portion 121 in advance (see FIG. 4 (a)). One gain (here, the gain G0) selected from the second predetermined number (here, 4) of steps of gains is set, and a direction selected from the directions (here, the directions D0, D2, D4, D6, D8, D10, D12, and D14) contained in one group stored in the direction storage portion 121 is set in a predetermined order. After all the directions contained in the one group stored in the direction storage portion 121 are set, the other one gain (here, the gain G2) selected from the second predetermined number of steps of gains is set, and a direction selected from the directions contained in the one group stored in the direction storage portion 121 is set in a predetermined order. After all the directions contained in the one group stored in the direction storage portion 121 are set, the one gain (here, the gain G0) selected from the predetermined number of steps of gains is set, and a direction selected from the directions (here, the directions D1, D3, D5, D7, D9, D11, D13, and D15) contained in the other one group stored in the direction storage portion 121 is set in a predetermined order. After all the directions contained in the other one group stored in the direction storage portion 121 are set, the other one gain (here, the gain G2) selected from the second predetermined number of steps of gains is set, and a direction selected from the directions contained in the other one group stored in the direction storage portion 121 is set in a predetermined order. Accordingly, an appropriate direction and an appropriate gain value of a smart antenna can be more efficiently searched for.

In other words, because the directions one of which is high in the possibility that the receiving state for the one is determined good are contained in the one group (here, the first group shown in FIG. 4 (a)) of the direction storage portion 121, and the one gain (here, the gain G0) selected from the second predetermined number of steps of gains is set, and a direction selected from the directions contained in the one group stored in the direction storage portion 121 is set in a predetermined order, accordingly the possibility that a receiving state is determined good during the process (hereinafter, called the first process) is high, and an appropriate direction and gain value of a smart antenna can be more efficiently searched for.

In other words, because the gains one of which is high in the possibility that the receiving state for the one is determined good are contained in the one group (here, the first group shown in FIG. 4 (b)) of the gain storage portion 122, and the one gain (here, the gain G0) selected from the gains contained in the one group stored in the gain storage portion 122 is set, and a direction selected from the directions contained in the one group (here, the first group shown in FIG. 4 (a)) stored in the direction storage portion 121 is set in a predetermined order, accordingly the possibility that a receiving state is determined good during the process (hereinafter, called the second process) is high, and an appropriate direction and gain value of a smart antenna can be more efficiently searched for.

In addition, if the receiving state is not determined good in the first process, the other one gain (here, the gain G2) selected from the second predetermined number of steps of gains is set, and a direction selected from the directions contained in the one group stored in the direction storage portion 121 is set in a predetermined order, accordingly the possibility that a receiving state is determined good during the process is high, and an appropriate direction and gain value of a smart antenna can be more efficiently searched for.

Further, in the direction storage portion 121, because each of the directions (here, the directions D0, D2, D4, D6, D8, D10, D12, and D14) is obtained by selecting clockwise from the first predetermined number (here, 16) of directions for every predetermined number (here, 2) of directions, it is high in the possibility that a direction for which the possibility that a receiving state is determined good is stored in one group (here, the first group shown in FIG. 4 (a)) in the direction storage portion 121, and therefore an appropriate direction and gain value of a smart antenna can be efficiently searched for.

In addition, the second predetermined number (here, 4) of steps of gains are divided into a plurality of groups (here, 2) of groups, and the gain identification information which is the identification information on gains is stored for each group in the gain storage portion 122 in advance (see FIG. 4 (b)). One gain (here, the gain G0) selected from the gains contained in the one group (here, the first group shown in FIG. 4 (b)) stored in the gain storage portion 122 is set, and a direction selected from the directions (here, the directions D0, D2, D4, D6, D8, D10, D12, and D14) contained in the one group (here, the first group shown in FIG. 4 (a)) stored in the direction storage portion 121 is set in a predetermined order. After all the directions contained in the one group stored in the direction storage portion 121 are set, the other one gain (here, the gain G2) selected from the gains contained in the one group stored in the gain storage portion 122 is set, and a direction selected from the directions contained in the one group stored in the direction storage portion 121 is set in a predetermined order. After all the directions contained in the one group stored in the direction storage portion 121 are set, the one gain (here, the gain G0) selected from the gains contained in the one group stored in the gain storage portion 122 is set, and a direction selected from the directions (here, the directions D1, D3, D5, D7, D9, D11, D13, and D15) contained in the other one group stored in the direction storage means is set in a predetermined order. After all the directions contained in the other one group stored in the direction storage portion 121 are set, the other one gain (here, the gain G2) selected from the gains contained in the one group stored in the gain storage portion 122 is set, and a direction selected from the directions contained in the other one group stored in the direction storage portion 121 is set in a predetermined order. Besides, when all the gains (here, the gains G and G2) contained in the one group stored in the gain storage portion 122, the setting processings of gains and directions are ended, therefore an appropriate direction and gain value can be more efficiently searched for.

In other words, because the gains one of which is high in the possibility that the receiving state for the one is determined good are contained in the one group (here, the first group shown in FIG. 4 (b)) of the gain storage potion 122, and the one gain (here, the gain G0) selected from the gains contained in the one group stored in the gain storage portion 122 is set, and a direction selected from the directions contained in the one group (here, the first group shown in FIG. 4 (a)) stored in the direction storage portion 121 is set in a predetermined order, accordingly the possibility that a receiving state is determined good during the process (hereinafter, called the second process) is high, and an appropriate direction and gain value of a smart antenna can be more efficiently searched for.

In addition, if the receiving state is not determined good in the second process, the other one gain (here, the gain G2) selected from the gains contained in the one group (here, the first group shown in FIG. 4 (b)) stored in the gain storage portion 122 is set, and a direction selected from the directions contained in the one group (here, the first group shown in FIG. 4 (a)) stored in the direction storage portion 121 is set in a predetermined order, accordingly the possibility that a receiving state is determined good during the process is high, and an appropriate direction and gain value of a smart antenna can be more efficiently searched for.

Besides, because the setting processings of gains and directions are ended when all the gains (here, the gains G0 and G2) contained in the one group (here, the first group shown in FIG. 4 (b)) stored in the gain storage portion 122, the searches for the gains for which it is low in the possibility that a receiving state is determined good can be skipped, and accordingly an appropriate direction and gain value can be more efficiently searched for.

Further, for example, if a connected smart antenna can be adjusted in only two steps, unnecessary search processing can be omitted by containing these two gains into the one group (here, the first group shown in FIG. 4 (b)) stored in the gain storage portion 122.

In addition, in the gain storage portion 122, because each of the gains contained in the one group (here, the first group shown in FIG. 4 (b)) is obtained by selecting from the second predetermined number (here, 4) of steps of gains for every predetermined number (here, 2) of steps, it is high in the possibility that a gain for which the possibility that a receiving state is determined good is high is stored in the one group of the gain storage portion 122, and therefore an appropriate direction and gain value of a smart antenna can be more efficiently searched for.

Besides, the first predetermined number is 16, and the second predetermined number is 4. The 16 directions are divided into two groups, and the direction storage portion 121 stores the direction identification information as the first group corresponding to the eight directions obtained by selecting clockwise from the 16 directions for every two directions, and stores the direction identification information corresponding to the remaining eight directions as the second group. The 4 steps of gains are divided into two groups, and the gain storage portion 122 stores the gain identification information as the first group corresponding to the two gains obtained by selecting from the 4 steps of gains for every two gains in the order of small to large values, and stores the gain identification information corresponding to the remaining two gains as the second group. Accordingly, an appropriate direction and gain value can be more efficiently searched for.

Because the specifications of a smart antenna provided in the EIA-909 standard describes that the first predetermined number (the number of directions that are changeable) is 16, and the second predetermined number (the number of steps of gains that are changeable) is 4, an appropriate direction and gain value can be efficiently searched for when a smart antenna that conforms to the EIA-909 standard is connected.

Moreover, the present invention can also be applied to the following cases: (A) In the present embodiment, the case where the broadcast receiving apparatus is the set top box 1 which receives a digital broadcast is explained. However, a broadcast receiving apparatus which receives an analog broadcast may be used as a broadcast receiving machine such as the set top box 1 and the like, or a broadcast receiving apparatus which receives both analog and digital broadcasts may be used as a broadcast receiving machine such as the set top box 1 and the like. When the set top box 1 receives an analog broadcast, a receiving state may be evaluated using S/N ratios instead of BERs.

(B) In the present embodiment, the case where in the direction storage portion 121, the first predetermined number (here, 16) of directions are divided into two groups is explained. However, in the direction storage portion 121, the first predetermined number (here, 16) of directions may be divided into more than three groups. FIG. 4 (c) is a table that shows another example of direction identification information stored in the direction storage portion 121.

In FIG. 4 (c), the 16 directions including the directions D0 to D15 shown in FIG. 3 (a) are divided into 4 groups (the first to fourth groups). The direction identification information (D0, D4, D8, and D12) corresponding to four directions each of which is obtained by selecting clockwise from every four directions of the 16 directions of D0 to D15 is stored as the first group. The direction identification information (D2, D6, D10, and D14) corresponding to the intermediate four directions contained in the first group is stored as the second group. The direction identification information (D1, D5, D9, and D13) corresponding to the four directions next to other directions in the clockwise direction is stored as the third group. The direction identification information (D3, D7, D11, and D15) corresponding to the remaining four directions is stored as the fourth group.

As described above, in a case where in the direction storage portion 121, the first predetermined number (here, 16) of directions are divided into more than three groups (here, 4), because the number of directions contained in the first group is small, an appropriate direction and gain value of a smart antenna can be more efficiently searched for.

(C) In the present embodiment, the case where in the gain storage portion 122, the second predetermined number (here, 4) of gains are divided into two groups is described. However, in the gain storage portion 122, the second predetermined number (here, 4) of gains may be divided into more than three groups. In this case, because the number of gains contained in the first group is small, an appropriate direction and gain value can be more efficiently searched for.

(D) In the present embodiment, described is the case where the receiving state evaluation portion 113 generates receiving quality information a predetermined times (here, 5 times) for every predetermined time period (here, 0.1 sec.). However, the receiving state evaluation portion 113 may generate receiving quality information only one time. In this case, an appropriate direction and gain value can be more efficiently searched for.

(E) In the present embodiment, described is the case where the MPU has the functional portions such as the channel setting portion 111, the condition setting portion 112, the receiving state evaluation portion 113, the receiving determination portion 114, the search end portion 115 and the like. However, at least one functional portion of the channel setting portion 111, the condition setting portion 112, the receiving state evaluation portion 113, the receiving determination portion 114, and the search end portion 115 may be configured with hardware such as a circuit.

What is claimed is:

1. A broadcast receiving apparatus to which a smart antenna so structure as to be capable of changing its directivity direction in a first predetermined number of directions and changing its gain in a predetermined number of steps is connected and which receives a television broadcast via the antenna and outputs it to a monitor, the broadcast receiving apparatus comprising:

condition storage means for storing a direction and a gain as receiving conditions which are set for the smart antenna for each channel;

channel setting means for selecting a channel to receive a broadcast from a plurality of predetermined channels and for setting it in succession;

receiving means for via the smart antenna receiving a television broadcast corresponding to a channel set by the channel setting means;

condition setting means which whenever a channel is set by the channel setting means, selects a gain from a second predetermined number of steps of gains and sets it in a predetermined order, and selects a direction from the first predetermined number of directions and sets it in a predetermined order;

receiving state evaluation means which whenever a gain and a direction are set by the condition setting means, sets the smart antenna to the set one gain and one direction, and generates receiving quality information which indicates the quality of a receiving state of a television broadcast received via the receiving means;

receiving determination means for determining whether or not the receiving state is good based on the receiving quality information generated by the receiving state evaluation means;

search end means which when the receiving state is determined good by the receiving determination means, records the one gain and one direction set by the condition setting means as the receiving conditions into the condition storage means, and makes the condition setting means end the setting processings of gains and directions; and direction storage means for storing direction identification information, which is the identification information on a direction, for each one of groups obtained by dividing the first predetermined number of directions; wherein the condition setting means selects one gain from the second predetermined number of steps of gains and sets it, and selects a direction from the directions contained in one group stored in the direction storage means and sets it in a predetermined order;

after all the directions contained in one group stored in the direction storage means are set, selects the other one gain from the second predetermined number of steps of gains and sets it, and selects a direction from the directions contained in the one group stored in the direction storage means and sets it in a predetermined order;

after all the directions contained in one group stored in the direction storage means are set, selects the one gain from the second predetermined number of steps of gains and sets it, and selects a direction from the directions contained in the other one group stored in the direction storage means and sets it in a predetermined order; and after all the directions contained in the other one group stored in the direction storage means are set, selects the other one gain from the second predetermined number of steps of gains and sets it, and selects a direction from the directions contained in the other one group stored in the direction storage means and sets it in a predetermined order.

2. The broadcast receiving apparatus according to claim 1, wherein the receiving state evaluation means generates receiving quality information a predetermined times for every predetermined time period; and the receiving determination means determines that the receiving state is good when all the receiving quality information for the predetermined times indicates that the receiving state is good.

3. The broadcast receiving apparatus according to claim 2, wherein in the direction storage means, the directions contained in the one group are selected clockwise from the first predetermined number of directions for every predetermined number of directions.

4. The broadcast receiving apparatus according to claim 3, further comprising gain storage means for storing gain identification information, which is the gain information on a gain, for each one of groups obtained by dividing the second predetermined number of steps of gains; wherein the condition setting means selects one gain from the gains contained in one group stored in the gain storage means and sets it, and selects a direction from the directions contained in one group stored in the direction storage means and sets it in a predetermined order;

after all the directions contained in the one group stored in the direction storage means are set, selects the other one gain from the gains contained in the one group stored in the gain storage means and sets it, and selects a direction from the directions contained in the one group stored in the direction storage means and sets it in a predetermined order;

after all the directions contained in the one group stored in the direction storage means are set, selects the one gain from the gains contained in the one group stored in the gain storage means and sets it, and selects a direction from the directions contained in the other one group stored in the direction storage means and sets it in a predetermined order; and after all the directions contained in the other one group stored in the direction storage means are set, selects the other one gain from the gains contained in the one group stored in the gain storage means and sets it, and selects a direction from the directions contained in the other one group stored in the direction storage means and sets it in a predetermined order; and when all the gains contained in the one group stored in the gain storage means are set, the search end means makes the condition setting means end the setting processings of gains and directions.

5. The broadcast receiving apparatus according to claim 4, wherein in the gain storage means, the gains contained in the one group are selected from the second predetermined number of steps of gains for every predetermined number of steps.

6. The broadcast receiving apparatus according to claim 5, wherein the first predetermined number is 16, and the second predetermined number is 4, the 16 directions are divided into two groups, and the direction storage means stores the direction identification information as a first group corresponding to the eight directions selected clockwise from the 16 directions for every two directions, and stores the direction identification information corresponding to the remaining eight directions as a second group, and the 4 steps of gains are divided into two groups, and the gain storage means stores the gain identification information as a first group corresponding to the two gains selected from the 4 steps of gains for every two gains in the order of small to large values, and stores the gain identification information corresponding to the remaining two gains as a second group.

7. The broadcast receiving apparatus according to one of claim 2, wherein the receiving state evaluation means generates a bit error rate (BER) as the receiving quality information.

8. The broadcast receiving apparatus according to claim 7, wherein in the direction storage means, the directions contained in the one group are selected clockwise from the first predetermined number of directions for every predetermined number of directions.

9. The broadcast receiving apparatus according to claim 8, further comprising gain storage means for storing gain identification information, which is the gain information on a gain, for each one of groups obtained by dividing the second predetermined number of steps of gains; wherein the condition setting means selects one gain from the gains contained in one group stored in the gain storage means and sets it, and selects a direction from the directions contained in one group stored in the direction storage means and sets it in a predetermined order;

after all the directions contained in the one group stored in the direction storage means are set, selects the other one gain from the gains contained in the one group stored in the gain storage means and sets it, and selects a direction from the directions contained in the one group stored in the direction storage means and sets it in a predetermined order;

after all the directions contained in the one group stored in the direction storage means are set, selects the one gain from the gains contained in the one group stored in the gain storage means and sets it, and selects a direction from the directions contained in the other one group stored in the direction storage means and sets it in a predetermined order; and after all the directions contained in the other one group stored in the direction storage means are set, selects the other one gain from the gains contained in the one group stored in the gain storage means and sets it, and selects a direction from the directions contained in the other one group stored in the direction storage means and sets it in a predetermined order; and when all the gains contained in the one group stored in the gain storage means are set, the search end means makes the condition setting means end the setting processings of gains and directions.

10. The broadcast receiving apparatus according to claim 9, wherein in the gain storage means, the gains contained in the one group are selected from the second predetermined number of steps of gains for every predetermined number of steps.

11. The broadcast receiving apparatus according to claim 10, wherein the first predetermined number is 16, and the second predetermined number is 4, the 16 directions are divided into two groups, and the direction storage means stores the direction identification information as a first group corresponding to the eight directions selected clockwise from the 16 directions for every two directions, and stores the direction identification information corresponding to the remaining eight directions as a second group, and the 4 steps of gains are divided into two groups, and the gain storage means stores the gain identification information as a first group corresponding to the two gains selected from the 4 steps of gains for every two gains in the order of small to large values, and stores the gain identification information corresponding to the remaining two gains as a second group.

12. The broadcast receiving apparatus according to one of claim 1, wherein
the receiving state evaluation means generates a bit error rate (BER) as the receiving quality information.

13. The broadcast receiving apparatus according to claim 12, wherein in the direction storage means, the directions contained in the one group are selected clockwise from the first predetermined number of directions for every predetermined number of directions.

14. The broadcast receiving apparatus according to claim 13, further comprising gain storage means for storing gain identification information, which is the gain information on a gain, for each one of groups obtained by dividing the second predetermined number of steps of gains; wherein
the condition setting means
selects one gain from the gains contained in one group stored in the gain storage means and sets it, and selects a direction from the directions contained in one group stored in the direction storage means and sets it in a predetermined order;
after all the directions contained in the one group stored in the direction storage means are set, selects the other one gain from the gains contained in the one group stored in the gain storage means and sets it, and selects a direction from the directions contained in the one group stored in the direction storage means and sets it in a predetermined order;
after all the directions contained in the one group stored in the direction storage means are set, selects the one gain from the gains contained in the one group stored in the gain storage means and sets it, and selects a direction from the directions contained in the other one group stored in the direction storage means and sets it in a predetermined order; and
after all the directions contained in the other one group stored in the direction storage means are set, selects the other one gain from the gains contained in the one group stored in the gain storage means and sets it, and selects a direction from the directions contained in the other one group stored in the direction storage means and sets it in a predetermined order; and
when all the gains contained in the one group stored in the gain storage means are set, the search end means makes the condition setting means end the setting processings of gains and directions.

15. The broadcast receiving apparatus according to claim 14, wherein in the gain storage means, the gains contained in the one group are selected from the second predetermined number of steps of gains for every predetermined number of steps.

16. The broadcast receiving apparatus according to claim 15, wherein the first predetermined number is 16, and the second predetermined number is 4, the 16 directions are divided into two groups, and the direction storage means stores the direction identification information as a first group corresponding to the eight directions selected clockwise from the 16 directions for every two directions, and stores the direction identification information corresponding to the remaining eight directions as a second group, and the 4 steps of gains are divided into two groups, and the gain storage means stores the gain identification information as a first group corresponding to the two gains selected from the 4 steps of gains for every two gains in the order of small to large values, and stores the gain identification information corresponding to the remaining two gains as a second group.

17. The broadcast receiving apparatus according to claim 1, wherein in the direction storage means, the directions contained in the one group are selected clockwise from the first predetermined number of directions for every predetermined number of directions.

18. The broadcast receiving apparatus according to claim 17, further comprising gain storage means for storing gain identification information, which is the gain information on a gain, for each one of groups obtained by dividing the second predetermined number of steps of gains; wherein
the condition setting means
selects one gain from the gains contained in one group stored in the gain storage means and sets it, and selects a direction from the directions contained in one group stored in the direction storage means and sets it in a predetermined order;
after all the directions contained in the one group stored in the direction storage means are set, selects the other one gain from the gains contained in the one group stored in the gain storage means and sets it, and selects a direction from the directions contained in the one group stored in the direction storage means and sets it in a predetermined order;
after all the directions contained in the one group stored in the direction storage means are set, selects the one gain from the gains contained in the one group stored in the gain storage means and sets it, and selects a direction from the directions contained in the other one group stored in the direction storage means and sets it in a predetermined order; and
after all the directions contained in the other one group stored in the direction storage means are set, selects the other one gain from the gains contained in the one group stored in the gain storage means and sets it, and selects a direction from the directions contained in the other one group stored in the direction storage means and sets it in a predetermined order; and
when all the gains contained in the one group stored in the gain storage means are set, the search end means makes the condition setting means end the setting processings of gains and directions.

19. The broadcast receiving apparatus according to claim 18, wherein in the gain storage means, the gains contained in the one group are selected from the second predetermined number of steps of gains for every predetermined number of steps.

20. The broadcast receiving apparatus according to claim 19, wherein the first predetermined number is 16, and the second predetermined number is 4, the 16 directions are divided into two groups, and the direction storage means stores the direction identification information as a first group corresponding to the eight directions selected clockwise from the 16 directions for every two directions, and stores the direction identification information corresponding to the remaining eight directions as a second group, and the 4 steps of gains are divided into two groups, and the gain storage means stores the gain identification information as a first group corresponding to the two gains selected from the 4 steps of gains for every two gains in the order of small to large values, and stores the gain identification information corresponding to the remaining two gains as a second group.

* * * * *